US008227825B2

(12) United States Patent
Diana et al.

(10) Patent No.: US 8,227,825 B2
(45) Date of Patent: *Jul. 24, 2012

(54) PHOTONIC STRUCTURES FOR EFFICIENT LIGHT EXTRACTION AND CONVERSION IN MULTI-COLOR LIGHT EMITTING DEVICES

(75) Inventors: Frederic S. Diana, Santa Clara, CA (US); Aurelien J. F. David, Palo Alto, CA (US); Pierre M. Petroff, Santa Barbara, CA (US); Claude C. A. Weisbuch, Paris (FR)

(73) Assignee: The Regents of the University of California, Oakland, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/845,308

(22) Filed: Jul. 28, 2010

(65) Prior Publication Data
US 2010/0327305 A1 Dec. 30, 2010

Related U.S. Application Data

(63) Continuation of application No. 11/251,365, filed on Oct. 14, 2005, now Pat. No. 7,768,023.

(51) Int. Cl.
*H01L 33/00* (2010.01)
(52) U.S. Cl. ............ 257/98; 257/99; 257/E33.061; 257/E33.067; 257/E33.069; 438/27; 438/29; 438/31; 438/32
(58) Field of Classification Search .......... 257/98, 257/99, E33.061, 67, 69; 438/27, 29, 31, 438/32
See application file for complete search history.

(56) References Cited

U.S. PATENT DOCUMENTS

| | | | |
|---|---|---|---|
| 5,226,053 A | 7/1993 | Cho et al. |
| 5,362,977 A | 11/1994 | Hunt et al. |
| 5,568,311 A | 10/1996 | Matsumoto |
| 5,779,924 A | 7/1998 | Krames et al. |
| 5,882,951 A | 3/1999 | Bhat |
| 6,155,699 A | 12/2000 | Miller et al. |
| 6,163,038 A | 12/2000 | Chen et al. |
| 6,357,889 B1 | 3/2002 | Duggal et al. |
| 6,504,180 B1 | 1/2003 | Heremans et al. |
| 6,525,464 B1 | 2/2003 | Chin |

(Continued)

FOREIGN PATENT DOCUMENTS
EP     1081771     3/2001
(Continued)

OTHER PUBLICATIONS

International Search Report mailed Nov. 1, 2007 for International Application No. PCT/US2006/40384 filed on Oct. 13, 2006.

(Continued)

*Primary Examiner* — Kiesha R Bryant
*Assistant Examiner* — Minchul Yang
(74) *Attorney, Agent, or Firm* — Gates & Cooper LLP

(57) ABSTRACT

A high efficiency light emitting diode (LED) comprised of a substrate, a buffer layer grown on the substrate (if such a layer is needed), a first active region comprising primary emitting species (PES) that are electrically-injected, a second active region comprising secondary emitting species (SES) that are optically-pumped by the light emitted from the PES, and photonic crystals, wherein the photonic crystals act as diffraction gratings to provide high light extraction efficiency, to provide efficient excitation of the SES, and/or to modulate the far-field emission pattern.

23 Claims, 14 Drawing Sheets

U.S. PATENT DOCUMENTS

| | | | |
|---|---|---|---|
| 6,538,371 | B1 | 3/2003 | Duggal et al. |
| 6,611,003 | B1 | 8/2003 | Hatakoshi et al. |
| 6,657,236 | B1 | 12/2003 | Thibeault et al. |
| 6,743,648 | B2 | 6/2004 | Kise et al. |
| 6,746,295 | B2 | 6/2004 | Sorg |
| 6,903,379 | B2 | 6/2005 | Wang et al. |
| 7,037,742 | B2 | 5/2006 | Slater, Jr. et al. |
| 7,098,589 | B2 | 8/2006 | Erchak et al. |
| 2003/0178626 | A1 | 9/2003 | Sugiyama et al. |
| 2004/0211970 | A1 | 10/2004 | Hayashimoto et al. |
| 2005/0082545 | A1 | 4/2005 | Wierer, Jr. |
| 2005/0156510 | A1 | 7/2005 | Chua et al. |
| 2005/0205883 | A1 | 9/2005 | Wierer et al. |
| 2005/0205884 | A1 | 9/2005 | Kim et al. |
| 2006/0202226 | A1 | 9/2006 | Weisbuch et al. |

FOREIGN PATENT DOCUMENTS

| | | |
|---|---|---|
| JP | 2005-268323 | 9/2005 |
| JP | 2005-268809 | 9/2005 |
| WO | 2004-093267 | 10/2004 |
| WO | 2005083037 | 9/2005 |

OTHER PUBLICATIONS

Benisty et al., "Impact of Planar Microcavity Effects on Light Extraction—Part I: Basic Concepts and Analytical Trends," 1998, IEEE J. Quantum Electron, vol. 34:1612-1631.

Boroditsky et al., "Light-Emitting Diode Extraction Efficiency," 1997, Proceedings of the SPIE—The International Society for Optical Engineering, SPIE-Int. Soc. Opt. Eng., vol. 3002:119-122.

Delbeke et al., "High-Efficiency Semiconductor Resonant-Cavity Light-Emitting Diodes: A Review," 2002, IEEE J. on selected topic in Quantum Electronics, vol. 8(2):189-206.

Eriksson et al., "Highly Directional Grating Outcouplers with Tailorable Radiation Characteristics," 1996, IEEE J. Quantum Electronics, vol. 32, No. 6, 1038-1047.

Guo et al., "Photon Recycling Semiconductor Light Emitting Diode," 1999, IEDM, International Electron Devices Meeting, Technical Digest, IEDM-99, 600-603.

Lukosz, "Light emission by multiple sources in thin layers. I. Radiation patterns of electric and magnetic dipoles" 1981, J. Opt. Soc. Am. ,Val. 71: 744-754.

Rattier et al., "Omnidirectional and compact guided light extraction from Archimedean photonic lattices," 2003, Appl. Phys. Lett., vol. 83, No. 7: 1283-1285.

Rattier et al., "Toward Ultrahigh-Efficiency Aluminum Oxide Microcavity Light-Emitting Diodes: Guided Mode Extraction by Photonic Crystals" 2002, IEEE Sel. Top. Quantum Electronics. vol. 8, No. 2: 238-247.

Schnitzer et al., "30% external quantum efficiency from surface textured, thin-film light emitting diodes," 1993, Applied Physics Letters, 63, No. (16) 2174-2176.

Suhara et al, "Broad area and MOPA lasers with integrated grating components for beam shaping and novel functions," 2003, Proc. SPIE vol. 4995, p. 10-21.

JP Office Action dated Feb. 27, 2012, Application No. 2008-535773, with English translation.

PHOTONIC STRUCTURES FOR EFFICIENT LIGHT EXTRACTION AND CONVERSION IN MULTI-COLOR LIGHT EMITTING DEVICES

CROSS-REFERENCE TO RELATED APPLICATIONS

This application is a continuation of and claims the benefit under 35 U.S.C. Section 120 of the following co-pending and commonly-assigned U.S. application:

U.S. Utility application Ser. No. 11/251,365, filed on Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,", now U.S. Pat. No. 7,768,023, issued Aug. 3, 2010;

which application is incorporated by reference herein.

This application is related to the following co-pending and commonly-assigned applications:

U.S. Utility application Ser. No. 11/067,910, filed on Feb. 28, 2005, by Claude C. A. Weisbuch, Aurelien J. F. David, James S. Speck, and Steven P. DenBaars, entitled "SINGLE OR MULTI-COLOR HIGH EFFICIENCY LIGHT EMITTING DIODE (LED) BY GROWTH OVER A PATTERNED SUBSTRATE," now U.S. Pat. No. 7,291,864, issued Nov. 6, 2007;

U.S. Utility application Ser. No. 11/067,956, filed on Feb. 28, 2005, by Claude C. A. Weisbuch, Aurelien J. F. David, and Steven P. DenBaars, entitled "HIGH EFFICIENCY LIGHT EMITTING DIODE (LED) WITH OPTIMIZED PHOTONIC CRYSTAL EXTRACTOR," now U.S. Pat. No. 7,582,910, issued Sep. 1, 2009;

U.S. Utility application Ser. No. 11/067,957, filed on Feb. 28, 2005, by Claude C. A. Weisbuch, Aurelien J. F. David, James S. Speck, and Steven P. DenBaars, entitled "HORIZONTAL EMITTING, VERTICAL EMITTING, BEAM SHAPED, DISTRIBUTED FEEDBACK (DFB) LASERS BY GROWTH OVER A PATTERNED SUBSTRATE," now U.S. Pat. No. 7,345,298, issued Mar. 18, 2008; and U.S. Utility application Ser. No. 10/938,704, filed Sep. 10, 2004, by Carole Schwach, Claude C. A. Weisbuch, Steven P. DenBaars, Henri Bénisty, and Shuji Nakamura, entitled "WHITE, SINGLE OR MULTI-COLOR LIGHT EMITTING DIODES BY RECYCLING GUIDED MODES," now U.S. Pat. No. 7,223,998, issued May 29, 2007;

all of which applications are incorporated by reference herein.

BACKGROUND OF THE INVENTION

1. Field of the Invention

The invention is related to photonic crystals and to light emitting diodes (LEDs) comprised of multiple-wavelength light sources such as phosphors.

2. Description of the Related Art

By analogy to atomic or molecular crystals, a photonic crystal can be described as a material or system presenting a spatial modulation of its index of refraction or dielectric permittivity. The modulation can be periodic, quasi-periodic, or only possess a short-range order. The periodicity of the lattice, when applicable, which can be one-dimensional (1D), two-dimensional (2D), or three-dimensional (3D), usually scales with the visible to infrared wavelengths for most applications. A distributed Bragg reflector (DBR) is the archetype of the 1D photonic crystal. DBRs present band structures analogous to that of electrons in crystals, with forbidden energies or photonic gaps, where there is no possibility for a photon to propagate. Defects can be introduced in the lattice to form photonic cavities or waveguides (these defects introduce states in the photonic bandgap which allow strongly localized modes, or light propagation, at the corresponding frequency). Photonic crystals have given rise to numerous applications in optoelectronic and photonic integrated devices.

A light emitting diode (LED) is a semiconductor device that emits light when electrically biased in the forward direction, which is known as electroluminescence (EL). An LED is usually comprised of two layers of a semiconducting material. One layer is doped with impurities to make it n-doped (i.e., with mobile electrons), while the other layer is doped with another type of impurities to make it p-doped (i.e., with mobile holes). This forms a structure called a p-n junction. When forward biased, electrons are injected into the junction from the n-region and holes are injected from the p-region. The electrons and holes release energy in the form of photons as they recombine. The wavelength of light, and therefore its color, depends on the bandgap energy of the materials forming the p-n junction. Very thin active layers of smaller bandgap materials, as compared to the p and n layers, referred to as quantum wells (QWs), can be introduced between the p and n layers to greatly increase the overall efficiency of the LEDs and vary the wavelength of emitted light.

Semiconductor materials quality has improved, mainly due to the improvements of their synthesis or growth techniques over the past two decades, namely molecular beam epitaxy (MBE), metal-organic chemical vapor deposition (MOCVD), liquid phase epitaxy (LPE), etc. The external quantum efficiency of semiconductor devices has then greatly improved, and new wavelength ranges have been obtained. Nitride compounds (GaN and related alloys AlGaN and InGaN) are now efficient emitters for violet and blue light, giving ~30 lumens/watt for commercially available LEDs, while phosphide (AlGaInP) and arsenide (GaAs/AlGaAs) compounds are widely used for red and infrared applications, producing ~30 lumens/watt for commercially available LEDs. LEDs are nearly as efficient as fluorescent tubes, but only in blue and red wavelength ranges.

The green-yellow portion of the visible spectrum is thus still lacking efficiency, while the combination of different colors on a single substrate (for example, as required in RGB pixels for color display applications, for white light emission, or for any other colored light generation requiring color mixing) is very limited with the semiconductors grown by the conventional methods mentioned previously. Alternative materials should be used, and phosphors can offer good solutions.

A phosphor is a material that can produce light after its excitation via the absorption of energy from an external source. The excitation source may comprise a sufficiently high-energy light beam produced by an LED. The generation of light by the phosphor from absorbed light is called photoluminescence (PL), also referred to as fluorescence.

Phosphors can be made of inorganic materials (garnets with rare earths), light emitting molecules or polymers, or semiconductor nanocrystal quantum dots (NQDs). The II-VI and III-V NQD systems offer both high absorption coefficients (and thus short absorption lengths) in the ultraviolet (UV) and blue ranges, and the possibility of changing the effective index of refraction by changing the matrix in which these NQDs are embedded (for example, $SiO_2$, $TiO_2$, or polymer and resins), without modifying the QD internal emission properties (center wavelength and width of emission band).

In the following, the term "phosphor" is used to represent any type of material performing light conversion, independently of its real nature (inorganic materials, light emitting molecules or polymers, colloidal quantum dots, or any other type of light emitting nanoparticles).

There are two basic combination schemes involving phosphors and LEDs:

(1) Blue-emitting LED combined with phosphors. This solution is currently used to produce white LEDs by combining blue emitting LEDs (in the GaN/InGaN system) with yellow photoluminescent phosphors. Color rendering, mixing, the different directionalities of the LED (directional) and phosphors (isotropic) emissions, and the overall efficiency of such devices are the most important issues related to this scheme.

(2) A UV-emitting LED combined with phosphors. In general, this method can provide both better color rendering and isotropy than (1), or better white equilibrium. However, the overall efficiency is still low.

These methods can produce a wide range of colors, from the blue to the red, and thus provide a solution for the low-cost fabrication of RGB displays, because phosphors can be positioned precisely to form the different pixels.

FIG. 1 illustrates a conventional EL-PL multi-color structure 100 that includes a phosphor layer 102, also known as secondary emitting species (SES) 102, coating the top of an LED 104, which includes a primary emitting species (PES) 106, a buffer layer 108, a substrate 110 and metal contacts 112 connected to a power supply 114. When forward biased, electrons (e$^-$) are injected into the p-n junction of the PES 106 from the n-region and holes (h$^+$) are injected from the p-region, wherein the electrons and holes cause the PES 106 to release energy in the form of photons 118 as they recombine. The SES 102 are optically-excited 116 after partly or fully absorbing directly extracted light 118 produced by the electrically-pumped PES 106. The absorption by the SES 102 occurs due to the presence of allowed electronic transitions in resonance with the PES 106 photon energies. The SES 102 then re-emits photons 116 of lower energies, or longer wavelengths, upon relaxation to their ground states. This PL by the SES 102 is used for display or lighting, sometimes in combination with the light emitted by the PES 106. This emission scheme is also referred to as light conversion.

For this structure to be highly efficient, the following requirements should be met:
it should be comprised of emitting species with high internal quantum efficiencies (defined as the ratio of the total emitted light intensity to the total absorbed light intensity),
it should maximize the extraction of both PES and SES emissions (possibly in different directions), and
it should maximize the absorption of the PES emission by the SES.

However, one of the major difficulties with such semiconductor-based structures is caused by the loss of large portions of both PES and SES light emissions due to total internal reflexion (TIR), as shown schematically in FIGS. 2A, 2B and 2C.

FIG. 2A illustrates a device 200 comprised of a semiconductor (dielectric) substrate 202 having planar layers with a high index of refraction (n) and including PES 204. Above the device 200 is an outer medium 206 (air or an epoxy layer) with a low n. Extracted emissions 208 from the PES 204 towards the outer medium 206 are shown, as are lost emissions 210 towards the substrate 202. Total internal reflections (TIR) 212 are also shown, which result in a lowest-order waveguided (WG) mode 214, also known simply as a guided mode, through the thin layers of the substrate 202.

When light is emitted within the planar layers of the substrate 202 with high values of n, only a limited cone of beams can be directly extracted upwards 208 into the outer medium 206. This "escape cone" defines the portion of a solid angle associated with directions of possible direct extraction 208. The escape cone's opening half-angle will be referred to as $\theta_c$ in the following ($\theta_c = \arcsin(n_{out}/n_{in})$). The higher the difference in indices of refraction, the smaller $\theta_c$, the narrower the escape cone.

The TIR modes 212, which remain trapped in the optically dense (high index) materials of the substrate 202, are mainly lost, due to internal re-absorption and non-radiative relaxation mechanisms, while sometimes escaping through the sides of the device 200. As WG modes 214, these can represent more than 50% of the overall emission by the PES 204, which are embedded in these high index layers. This loss mechanism is detrimental to the maximization of the extraction of the PES 204 emission.

When phosphors 216 (with a lower index) are placed on top of the optically dense layers 202 (with a higher index), a large part of their emissions 208 is also waveguided 214 inside the high index layers, as shown in FIGS. 2B and 2C, wherein 208a is emitted light directly extracted and absorbed by the phosphors 216, 208b is the PL emitted from the phosphors 216, 214a is a lower-order excitation WG mode and 214b is a higher-order excitation WG mode.

Indeed, electric dipoles, located sufficiently close to a high index layer, always exhibit emissions comprised of evanescent waves, which can efficiently couple to TIR modes. This is shown in the device 300 of FIG. 3A, which includes an electric dipole 302 as a source emitting at $\lambda_0$, close to a dense planar medium 304 (where $n_{in} > n_{out}$), i.e., at a distance d typically smaller than $\lambda_0$, and producing evanescent waves 306, which couple to TIR or WG modes 308 inside the high index layer 304.

FIG. 3B shows dipole emission diagrams for an horizontal and a vertical dipole in a medium with n=1.5 close to a planar cavity of n=2.5. Air is present above the structure, while a substrate with n=1.7 was chosen to be included in the bottom of the structure. The diagrams show the different contributions that combine to produce the dipoles emission: directly extracted light in air ($k_\parallel/k_0 < 1$), TIR ($1 < k_\parallel/k_0 < 1.7$), and WG modes ($k_\parallel/k_0 > 1.7$) are present, wherein $k_0$ is the wavevector of light in a vacuum and $k_\parallel$ is the in-plane component of the wavevector of light for the medium 304. FIG. 3C is a schematic illustrating the multilayer chosen for these simulations.

The closer the emitting dipoles 302 are to the denser planar medium 304, the larger the fraction of evanescent waves 306 (>50% of the overall emission for dipoles located in the vicinity of the interface, d<100 nm), and therefore of the TIR modes in the denser planar medium 304. It should be mentioned that near the interface, the 1D Purcell factor is not negligible and can reach 1.6 for these structures. This factor corresponds to the increase of the spontaneous emission rate $k_r$ of the SES, with the internal quantum efficiency given by $\eta_{int} = k_r/(k_r + k_{nr})$ for most light-emitting materials, with $k_{nr}$ the non-radiative recombination rate. NQDs can offer sufficiently high absorption coefficients such that the PES light can be absorbed within a few hundreds of nanometers, corresponding to the region of high Purcell factor.

With current state-of-art multi-color LEDs, the TIR or WG light is usually lost, and this accounts in a large part for the limited external efficiency of LEDs. The reduced overall efficiencies cause the devices to overheat, because higher applied voltages are necessary to compensate for the losses, and materials degradation is faster.

Furthermore, the phosphors that are commonly used (rare-earth garnets) are limited by the concentration of emitting ions, implying the LEDs to be coated with thick epoxy and phosphors mixtures (typically 1 mm in height or more), often in the form of a half-sphere to out-couple some TIR modes. These large dimensions in turn imply a reduction of brightness, and obviously of compactness, of the device.

There is a need in the art for improving the far-field patterns of the different components of emission (QWs, phosphors), which make the color rendering angle-dependent: for example, white light LEDs produced by combining blue QWs and yellow phosphors appear bluish in the middle and yellow in the outer regions of the far-field pattern (the color-rendering is not isotropic).

For these reasons, there is a need in the art for improving multi-color LEDs characteristics.

SUMMARY OF THE INVENTION

The present invention discloses design principles for and examples of high efficiency, bright, light emitting diodes (LEDs) emitting at various wavelengths by use of several emitting species and optimized photonic crystals. The LED is comprised of a substrate, a buffer layer grown on the substrate (if such a layer is needed), a first active region comprising primary emitting species (PES) that are electrically-injected, a second active region comprising secondary emitting species (SES) that are optically-pumped by the light emitted from the PES, and photonic crystals that extract waveguided modes emitted by the PES to optically pump the SES. The photonic crystals, acting as diffraction gratings, provide high light extraction efficiency, efficient excitation of the SES, and/or ways to design the far-field emission pattern for optimal shape.

BRIEF DESCRIPTION OF THE DRAWINGS

Referring now to the drawings in which like reference numbers represent corresponding parts throughout:

FIG. 2A illustrates device structure where total internal reflection (TIR) modes (represented as a single waveguided mode) are lost in conventional devices, while

FIG. 5A illustrates a structure that includes a buffer layer, a first active region including a PES, photonic crystal or grating, and a second active layer including a SES, whereas

FIGS. 7A and 7B illustrate the structure of an LED, while

DETAILED DESCRIPTION OF THE INVENTION

Figure 1:
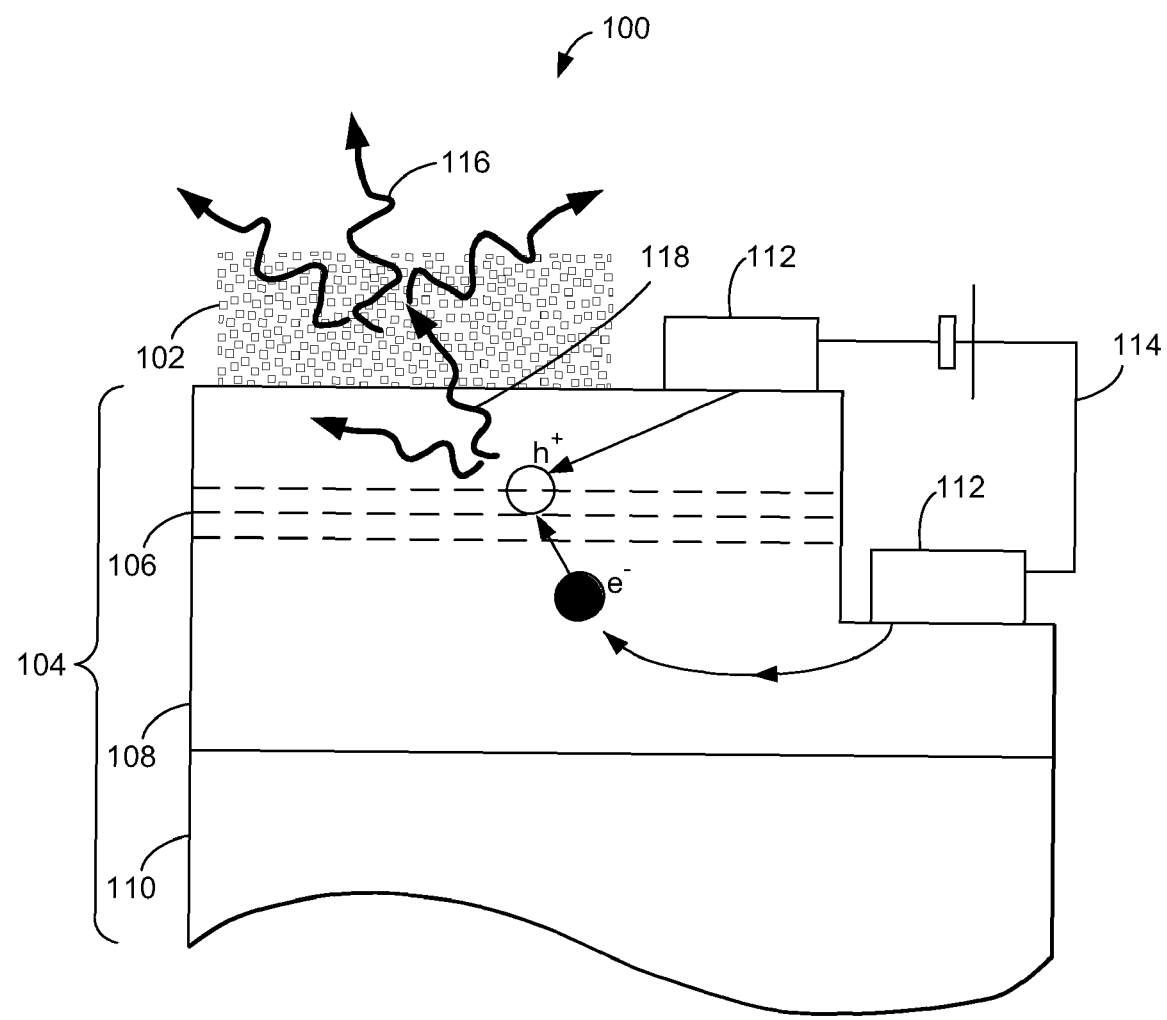
FIG. 1 illustrates a conventional electroluminescence-photoluminescence multi-color LED structure, wherein phosphors or secondary emitting species (SES) are optically-pumped by a semiconductor light-emitting diode comprising electrically-pumped light primary emitting species (PES).
Figure 2A:
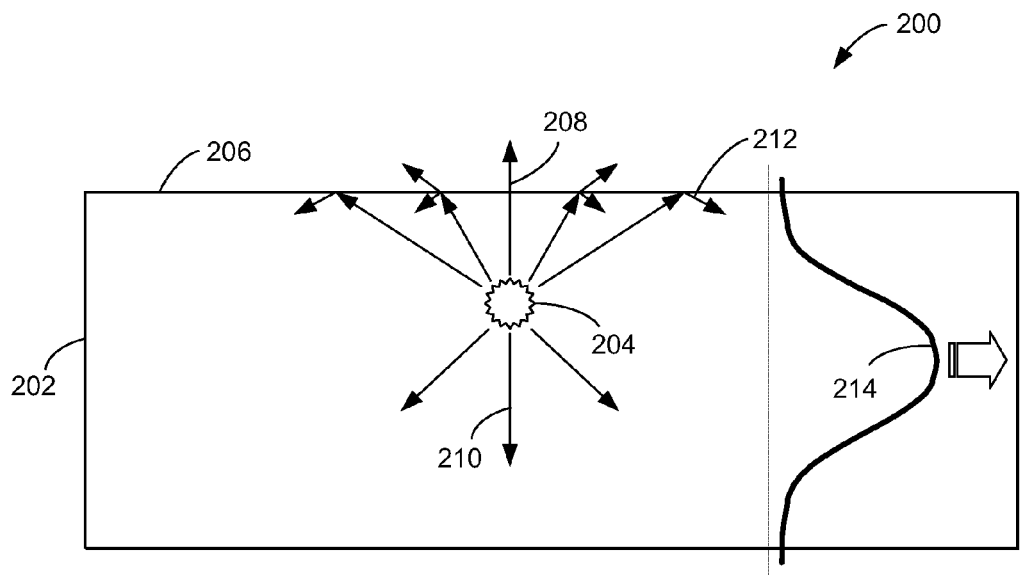
Figures 2B, 2C:
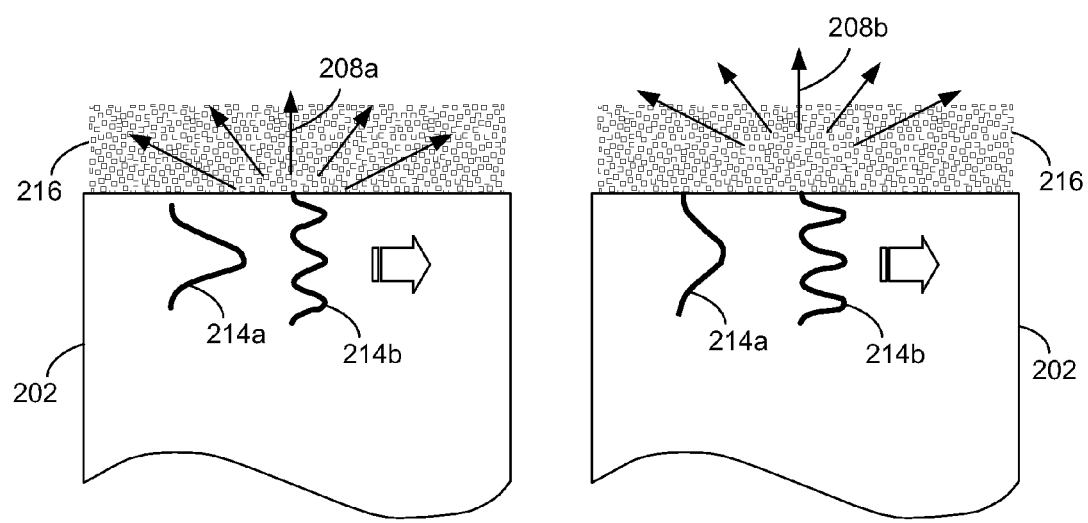
FIGS. 2B and 2C illustrate a conventional structure showing the two emitting species and the TIR involved for both of them.
Figure 3A:
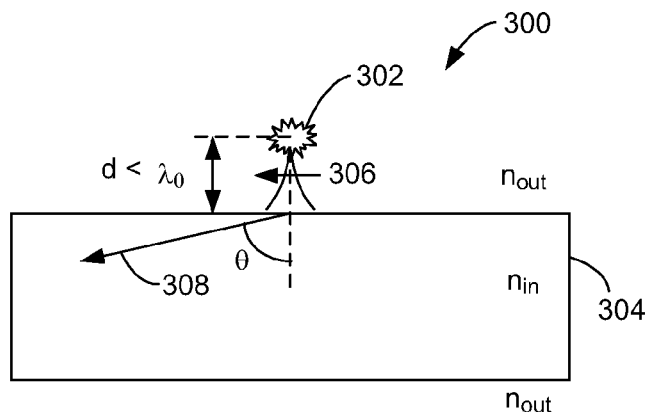
FIGS. 3A, 3B, and 3C illustrate coupling of evanescent waves produced by an external electric dipole source to propagating and TIR or WG modes inside the nearby high index planar layers.
Figure 3B:
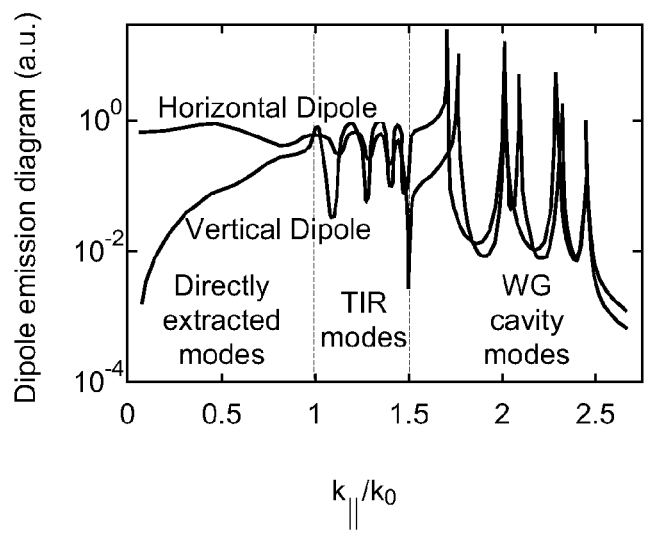
Figure 3C:
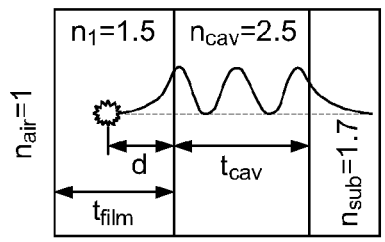

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes new multiple-light sources LEDs that provide increased light extraction and conversion efficiencies, as well as increased brightness, while retaining planar structures. The LEDs contain several emitting species, each providing light emission in a range of wavelengths. Some of the species are electrically-pumped, while other species are optically-pumped. Photonic crystals, acting as diffraction gratings, ensure efficient light extraction, efficient excitation of the optically-pumped species, and/or provide with a means for modifying the far-field emission pattern.

The LED is comprised of a substrate, a buffer layer grown on the substrate (if such a layer is necessary), a first active region including electrically-pumped PES, photonic crystals acting as diffraction gratings, and a second active region including optically-pumped SES. The SES absorbs part of the light emitted by the PES, and then re-emits light at a different wavelength range or at several ranges of wavelengths if multiple emitting species are combined in the SES. The LED may, for example, act as a white light source. In order to overcome the problem of light extraction, one or more photonic crystals can be included (for instance, at the interface between the two emitting species). These gratings can diffract light emitted in the TIR modes, thereby enhancing overall light extraction. They can also increase excitation of the SES by enhancing their interaction with the light emitted by the PES. The gratings may act on either one or all of the emitted wavelengths, possibly with different effects on the overall efficiency and far-field emission patterns.

If the SES layer is placed on top of the high index layers, the photonic crystals are used as extractors for all TIR or WG cavity modes. If the SES layer is placed away from the high index layers, for example, using a membrane and an air gap, or a very low index intermediate layer between the SES and the high index layers, two photonic crystals may be used: one on top of the high index layers to extract the PES WG modes and one in the SES layers in order to scatter the WG modes induced in this layer as well. The depth of the photonic crystals can then be modified to increase the fraction of light which is emitted upwards. The pitch and basis of the photonic crystals are used to control the far-field emission pattern.

TECHNICAL DESCRIPTION

In current structures, the excitation of the SES by the emission of the PES cannot be highly efficient because only a small part of the PES light is directly extracted, e.g., on the order of 10%. The required extraction of the TIR modes generates numerous novel ideas for the improvement of phosphors light conversion efficiency.

One approach is described in U.S. Utility application Ser. No. 10/938,704, filed Sep. 10, 2004, by Carole Schwach, Claude C. A. Weisbuch, Steven P. DenBaars, Henri Bénisty, and Shuji Nakamura, entitled "WHITE, SINGLE OR MULTI-COLOR LIGHT EMITTING DIODES BY RECYCLING GUIDED MODES," now U.S. Pat. No. 7,223,998, issued May 29, 2007, which application is incorporated by reference herein. This application focuses on the problem of light extraction from LEDs without phosphors, due to the efficient conversion of the TIR modes of a thin LED structure to WG modes.

The present invention, on the other hand, is directed to efficiency, color rendering, and brightness issues with phosphors-on-LED. The key to extract all TIR modes, increase the absorption of the PES emission by the SES, and re-distribute the far-field PES and SES emission pattern, lies in the 3D engineering of the index of refraction of the films constituting the device. The typical building-blocks of photonic devices should be considered and implemented: waveguides or planar cavities, reflectors, gratings, photonic crystals, etc., in combination with traditional geometric approaches (spherical-shaped phosphor layer, textured surface, etc.) Brightness and compactness may be improved by using SES of higher absorption coefficients, i.e., with an increased concentration of emitting centers or dipoles, such as emitting molecules or NQDs.

Figure 4A:
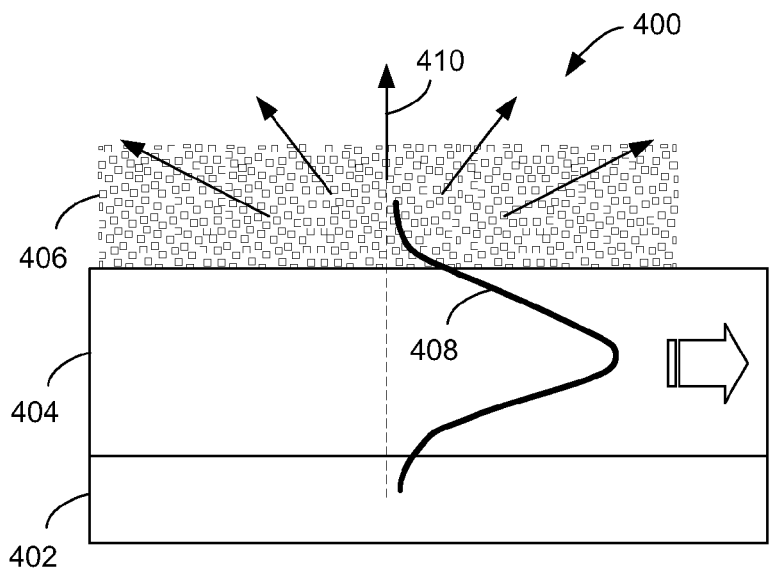
FIGS. 4A and 4B illustrate evanescent WG mode excitation of phosphors, wherein the effect is enhanced by concentrating as much as possible the field near the interface semiconductor/phosphor layers, by using an intermediate layer of a smaller index of refraction.
Figure 4B:
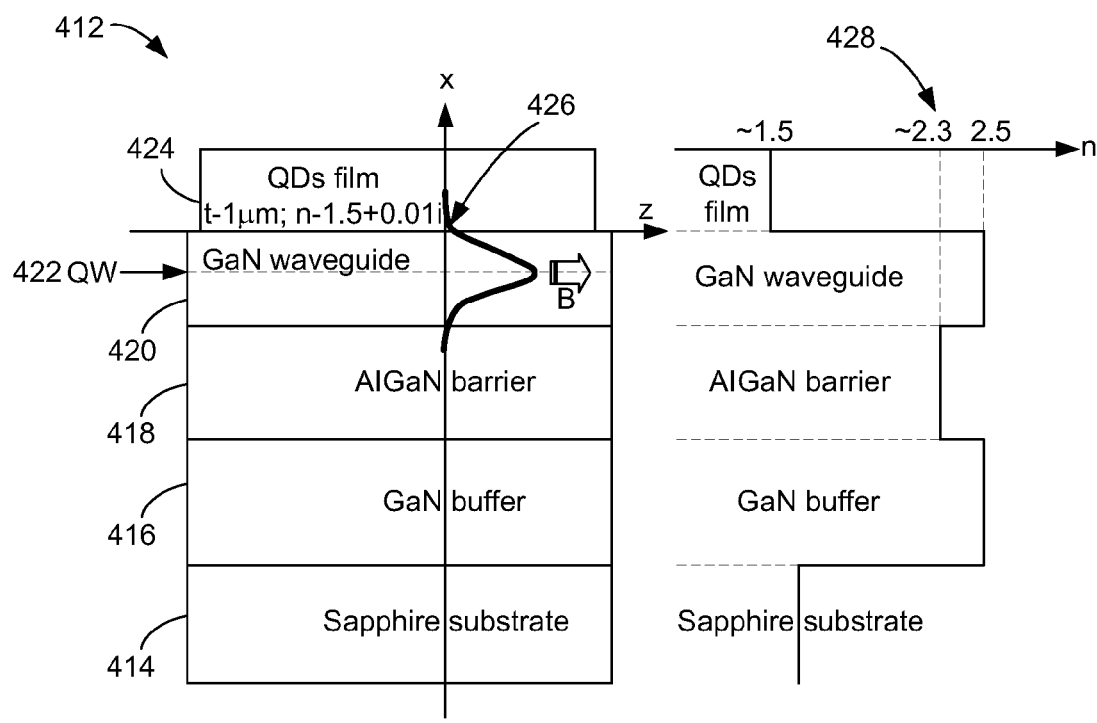

FIGS. 4A and 4B illustrate WG cavity modes excitation of phosphors, wherein the effect is enhanced by concentrating as much as possible the field near the interface semiconductor/phosphor layers, by using an intermediate layer of a smaller index of refraction, for example, on top of the buffer layer.

Specifically, FIG. 4A illustrates a device 400 comprised of a substrate 402 having a low index, one or more active layers 404, and a phosphor layer 406. The WG mode 408 leaks into the phosphor layer 406, resulting in PL emissions 410 from the phosphor layer 406.

In addition, FIG. 4B shows illustrates a device 412 comprised of a sapphire substrate 414 with n=1.8, a 2 µm thick GaN buffer layer 416 with n=2.5, a 500-1000 nm thick AlGaN barrier layer 418 with n=2.3-2.4, a 100-300 nm thick GaN waveguide layer 420 including QWs 422 with n=2.5, and a 1 µm thick QDs film 424 with n≈1.5±0.1, wherein the WG mode 426 leaks into the QDs film 424. The corresponding indices of refraction (n) are indicated in the graph 428 to the right of the device 412.

Such an effect is enhanced by incorporating an intermediate layer of lower index in the PES layer in order to increase the excitation of the SES by the PES WG cavity modes, and also by optimizing the index difference between the two materials. With such geometry, the SES will emit a large portion of their total emission into TIR or WG modes of the multilayer structure. Again, this emission limits the overall efficiency of the device. Incorporation of a grating or of a photonic crystal between the phosphors and the high index layer allows these modes to be extracted. A single photonic crystal is sufficient to extract both contributions (from the PES and from the SES), even though a large energy difference exists between the two luminescence bands, as illustrated in the following.

Figure 5A:
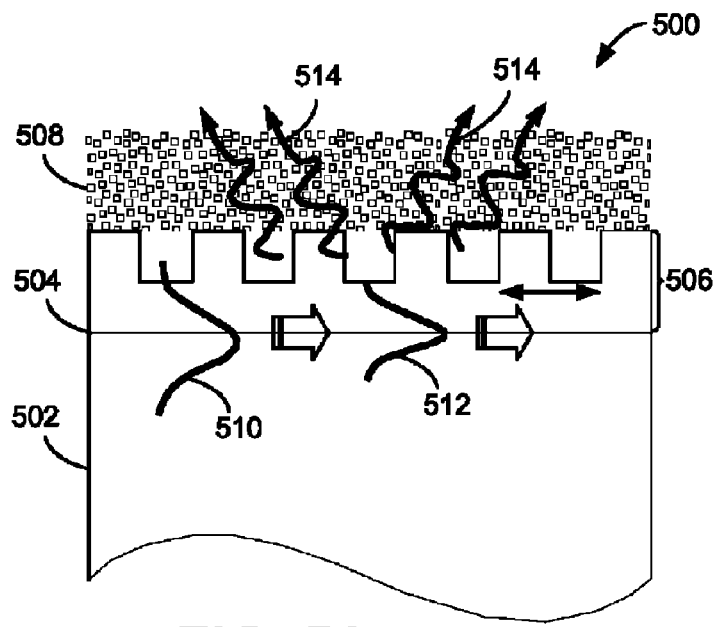

FIG. 5A illustrates a structure 500 that includes a support structure 502 (such as a buffer layer formed on top of a substrate), a first active region 504 including one or more PES in a PES layer that are electrically injected, one or more gratings or photonic crystals 506, and a second active region 508 including one or more SES in a SES layer that are optically pumped. Note that the photonic crystals 506 are formed proximate to the first and second regions 504 and 508.

The photonic crystals 506 extract the WG modes 510 emitted by the PES 504 to optically pump the SES 508. In addition, the photonic crystals 506, acting as scattering centers or diffraction gratings, extract the WG modes 510 emitted by the PES 504, extract the WG modes 512 emitted by the SES 508, which results in diffracted light 514 being emitted through the SES 508, and control directionality or isotropy of far-field emission patterns.

Generally, the photonic crystals 506 comprise one or more intermediate layers integrated above or below the PES layer 504 or the SES layer 508. One or more of the intermediate layers may be textured.

In one embodiment, the photonic crystals 506 are one-dimensional (1D) diffraction gratings that provide light extraction in all directions close to a direction perpendicular to the gratings. In another embodiment, the photonic crystals 506 are periodic, quasi-periodic, or short-range ordered two-dimensional (2D) scattering centers or diffraction gratings that provide omni-directional light extraction or directional far-field emission patterns. In yet another embodiment, the photonic crystals 506 are randomly textured two-dimensional (2D) scattering regions that provide omni-directional light extraction and isotropic emission far-field patterns.

Parameters of the photonic crystals 506 are chosen such that light extraction is optimized upwards or downwards. Moreover, the parameters of the photonic crystals 506 may vary across the LED.

Figure 5B:
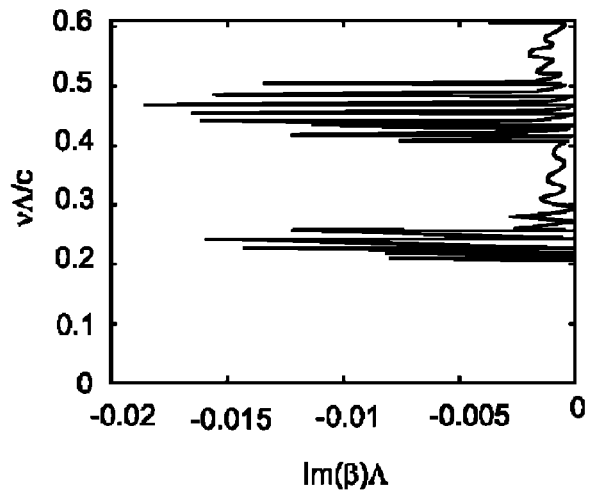
FIGS. 5B and 5C are graphs that illustrate a complex dispersion relationship (reduced frequency vs. reduced in-plane wavevector) of a WG mode in a planar cavity modulated by a grating on its surface, as shown in the schematic of FIG. 5A.
Figure 5C:
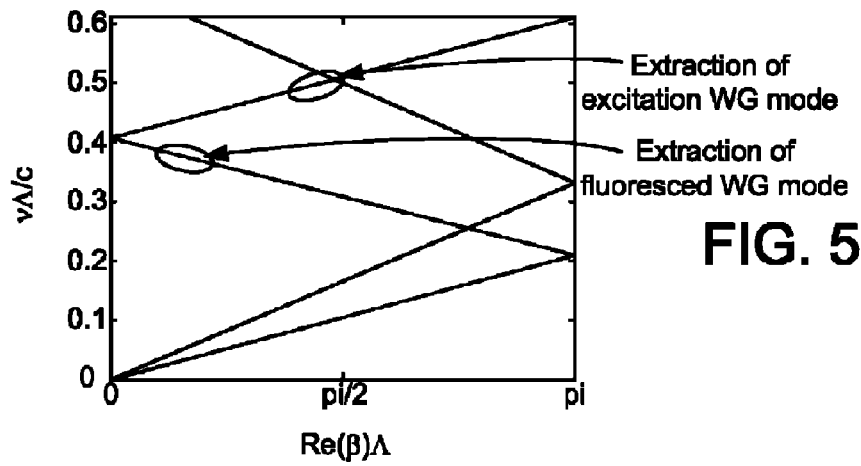

FIGS. 5B and 5C show the calculated complex dispersion relationship (reduced frequency vs. reduced in-plane wavevector) of a WG mode in a multilayer, including a planar cavity, with a shallow 1D grating on its surface, as shown in the schematic of FIG. 5A. Dashed lines are the light lines for radiation in air or in the sapphire substrate. For this WG mode and this device geometry, both frequencies (corresponding to the excitation light and to the phosphors PL) can be simultaneously extracted at different angles. Different frequencies precisely occur in the case of phosphors on LED.

Experimental results have established the proof of concept.

A 2 µm-thick GaN buffer layer was grown on a sapphire substrate by MOCVD and several samples were cut from this wafer. Processing steps, including holographic exposures, were then performed to form 1D gratings (of various periodicities Λ) on the top surface of the samples, and over large areas. The depths of the gratings were between 150 and 200 nm, as shown in FIG. 6.

Figure 6:
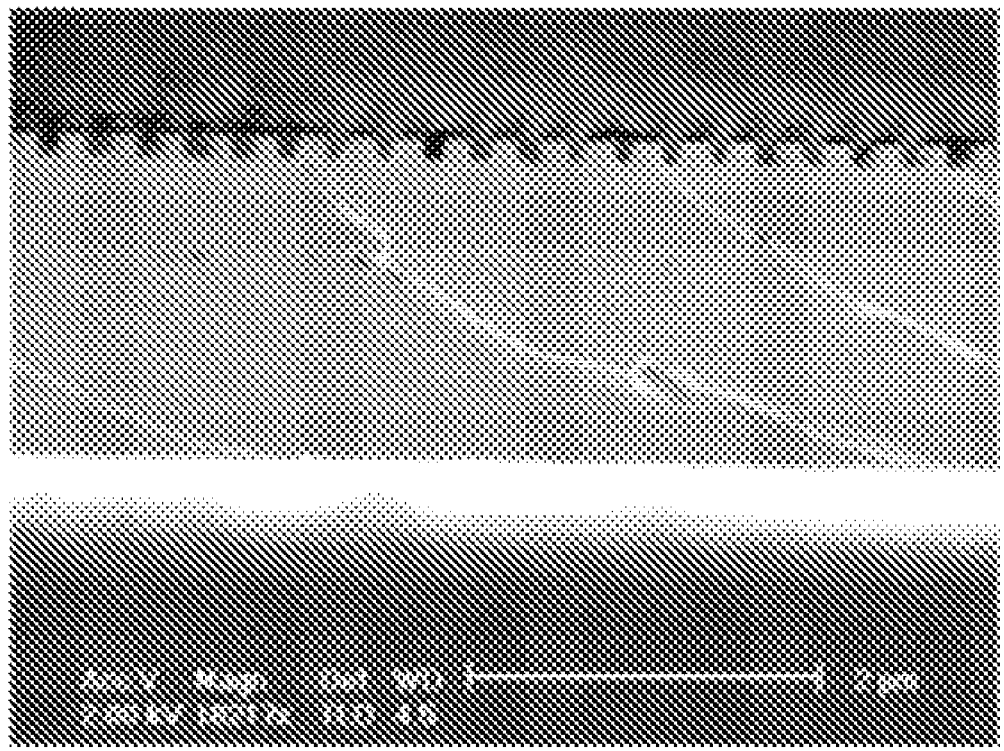
FIG. 6 is a scanning electron microscope (SEM) image that shows a 165 nm periodicity, 180 nm deep, 1D grating etched in a 2 µm-thick GaN buffer layer MOCVD-grown on top of a sapphire substrate, wherein the GaN buffer also contains InGaN QWs as PES.

Specifically, FIG. 6 shows a 165 nm periodicity, 180 nm deep, 1D grating etched in a 2 µm-thick GaN buffer layer MOCVD-grown on top of a sapphire substrate. The GaN buffer also contains InGaN QWs as the PES (not resolved in this SEM image). A 2 µm-thick GaN layer between air and sapphire can theoretically contain between 10 and 20 WG modes (in the wavelengths range 400 to 800 nm). The gratings were coated with CdSe NQDs (drop cast from toluene solution), which formed layers approximately 1 µm thick, after drying.

Figure 7A:
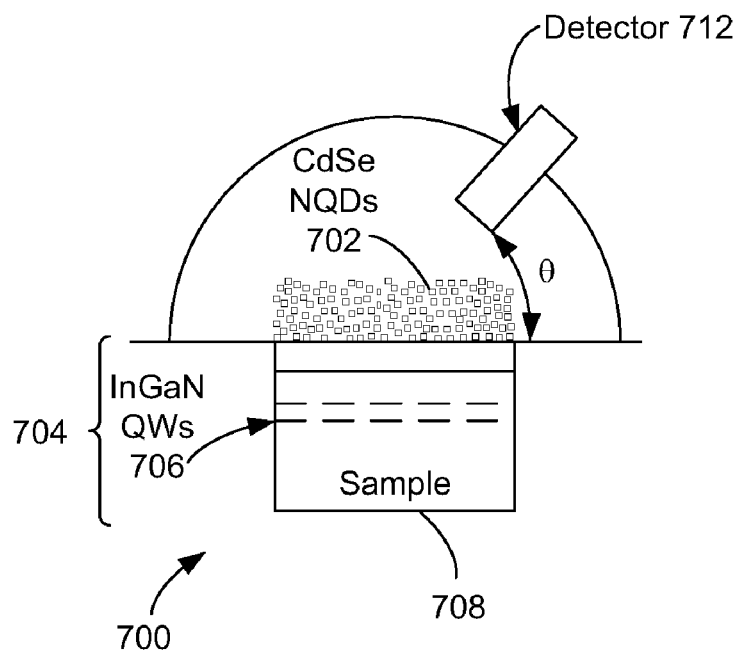
Figure 7B:
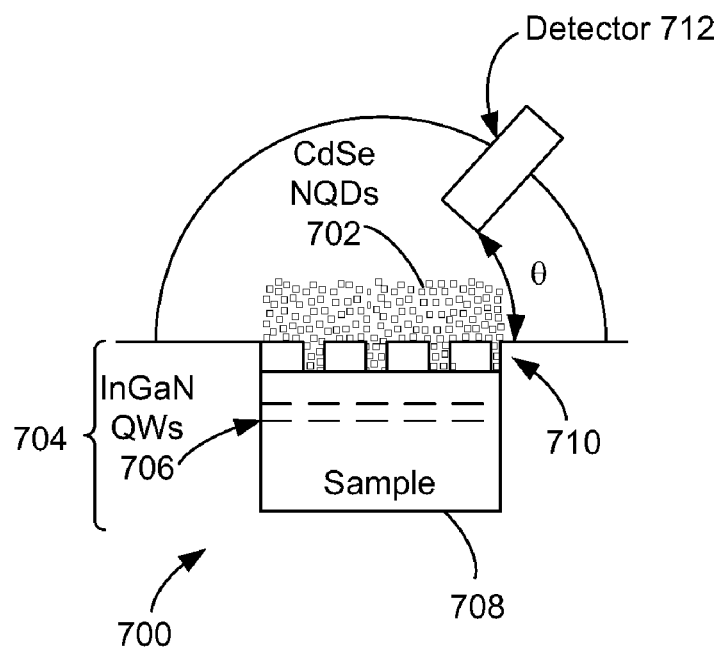

FIGS. 7A and 7B illustrate the same multilayer structure 700 that includes CdSe NQD phosphors 702 coating a GaN layer 704 containing InGaN QWs 706 grown by MOCVD on top of a sapphire substrate 708, and a 1D grating 710 on top of the GaN layer. In both FIGS. 7A and 7B, a detector 712 is positioned above the multilayer 700 at an azimuth angle θ. The sample is rotated to present either the grating lines parallel (FIG. 7A) or perpendicular (FIG. 7B) to the rotation plane of the detector.

Figure 7C:
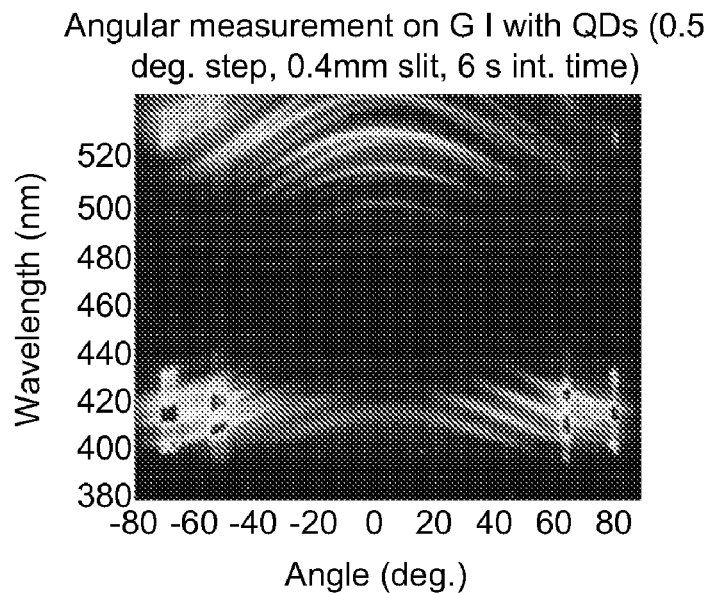
FIGS. 7C and 7D are plots of two angular resolved PL measurements of the LED.
Figure 7D:
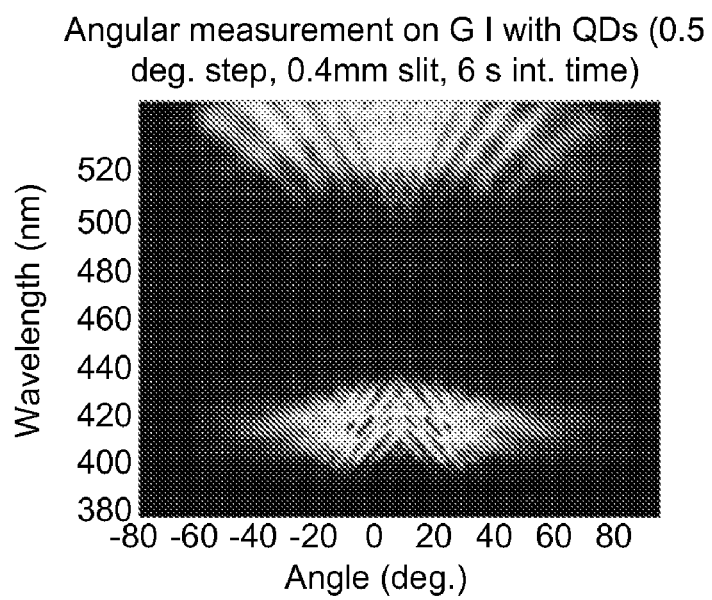

Measurements were performed on the structures of FIGS. 7A and 7B using two different grating periodicities but with the same GaN/AlGaN wafer, and the same CdSe NQD phosphors. FIGS. 7C and 7D show two angular resolved PL measurements, which combine the different PL spectra collected as a function of the azimuth angle (far-field emission pattern), after exciting both violet InGaN QWs and yellow-green NQD phosphors with a UV HeCd laser beam ($\lambda_0$=325 nm).

FIG. 7C shows an angular measurement parallel to the grating (of periodicity 260 nm) as a reference. Indeed, the grating can effectively diffract light only in the directions which are near the perpendicular to the grating lines. Two major bands of emission can be seen around 410 nm and 520 nm; these are the directly extracted PL from the InGaN QWs and the NQD phosphors, respectively. Note the quasi-isotropic shape of the emission aside from side peaks, which are assigned to scattered light and/or WG modes escaping from the sides of the sample. Finally, the spectrum is comprised of a finer structure made of several thinner curves: these are caused by Fabry-Perot constructive interferences stemming from the presence of the two interfaces GaN/air and GaN/sapphire, as well as from the diffraction of WG modes that do not propagate parallel to the grating lines.

FIG. 7D shows an angular measurement perpendicular to the grating. In this case, several closely spaced curved lines clearly appear in the spectrum on top of the directly extracted PL and Fabry-Perot modulations. Those lines are the radiative components of the WG modes which, in the direction perpendicular to the grating, are produced via diffraction. These lines are labeled as "diffracted modes" in the following.

By comparing FIGS. 7C and 7D, since the spectra were acquired on the same sample and in the same conditions, one can clearly observe an increase of PL signal in the perpendicular direction as compared to the parallel one, at almost all wavelengths and almost all angles. There is, therefore, increased light extraction of both PES and SES emissions at least in directions close to the perpendicular to the grating (2D gratings or photonic crystals will provide omni-directional extraction).

Figure 8A:
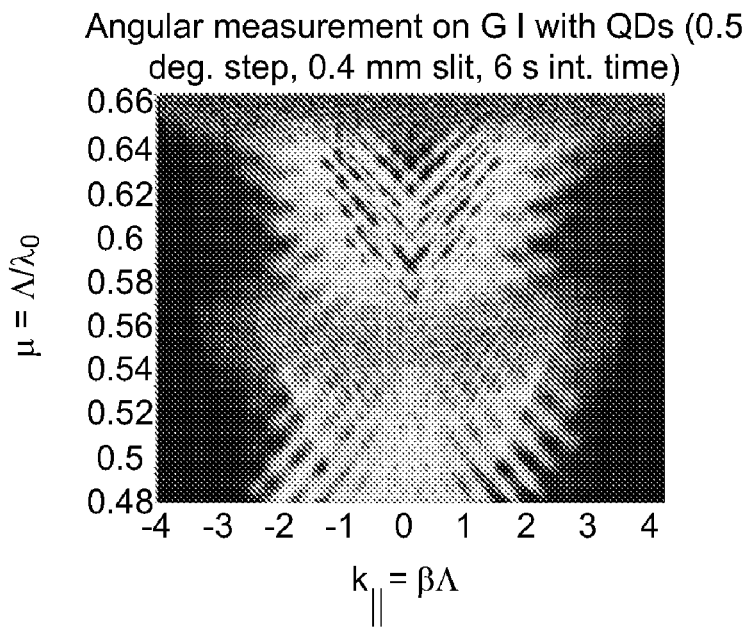
FIGS. 8A and 8B are plots that show measured modal dispersion relationships (reduced frequency vs. reduced in-plane wavevector) deduced from measured angular spectrum of FIG. 5C.
Figure 8B:
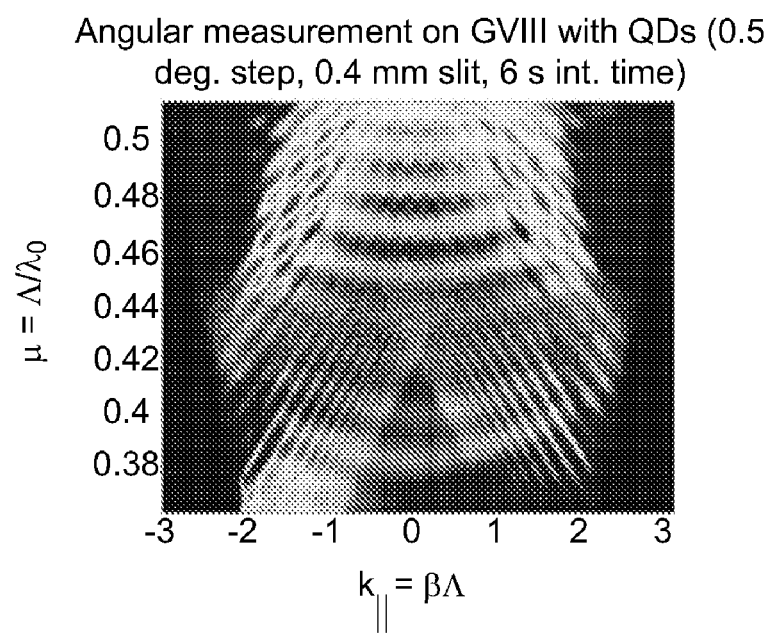

FIGS. 8A and 8B show modal dispersion relationships (reduced frequency vs. reduced in-plane wavevector) directly obtained from the measured angular spectrum of FIG. 5C (because $k_{\parallel}=k_0 \sin \theta$), wherein Λ=260 nm in FIG. 8A, and from another measurement on a similar sample, but with Λ=220 nm, in FIG. 8B. The major difference between the two plots is that the diffracted modes are simply shifted downwards when the periodicity decreases, as can be expected from scale invariance. The change of periodicity modifies the light extraction and directionalities of the diffracted light from both emissions. The extraction is more vertical in the case of the larger periodicity. Finally, it is clear from those two plots that only sufficiently high-order WG modes (those of low effective index of refraction) are efficiently diffracted; the high index ones are localized in the inner part of the GaN layer and do not overlap as much with the grating as the others.

These results show that a simple grating can increase the extraction of both PES and SES emissions. The overall increased PL of the SES thus stems from two complementary effects. First, the improved extraction of the PES emission increases the excitation of the SES, which in turn produces a more intense directly extracted emission, and secondly, the grating extracts the WG modes induced by the SES emission into evanescent waves. They also show that a single grating can redirect parts of the emission in a controllable way (because the diffracted modes direction only depends on the geometry of the layers and periodicity of the grating) and allow compensating for non-isotropic color-rendering issues with current LEDs.

From these basic examples, it is possible to generalize the principles and formulate a number of alternatives and/or complementary structures:

[1] The SES layer can be positioned above a low refraction index layer (air gap or low index dielectric, such as porous silicon dioxide), thus canceling the coupling of the SES evanescent waves to TIR substrate modes or WG cavity modes. SES WG modes are then present inside this layer and not in the high index layers, where only PES WG modes are propagating. Although this separation of the phosphor layer from the main substrate suppresses the Purcell effect, it can allow for a better thermal insulation of the phosphor layer from the LED substrate, the temperature of which can increase by 100° C. under operation. This separation implies the following point.

Figure 9:
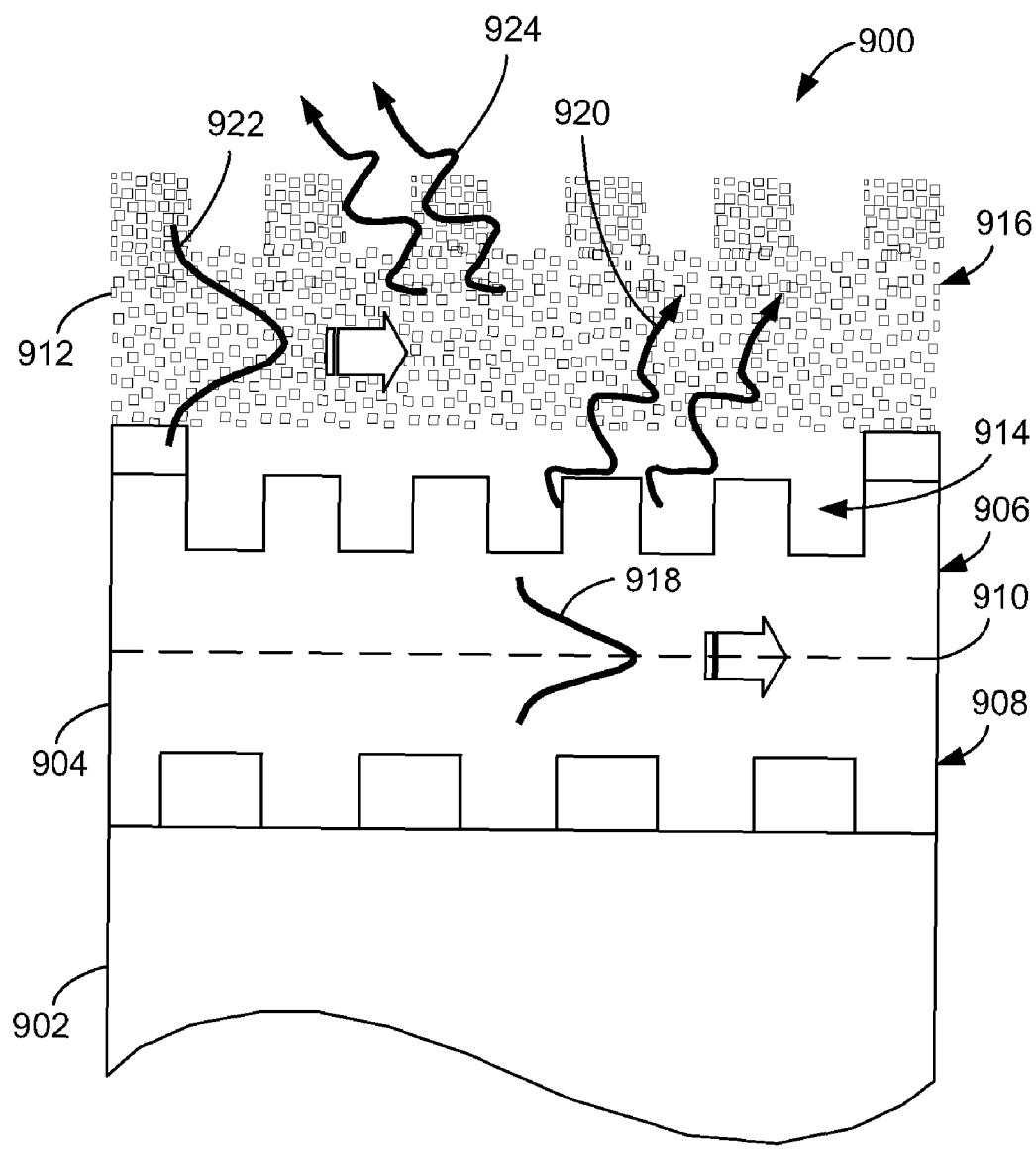
FIG. 9 illustrates a complementary device structure that combines several gratings or photonic crystals to extract different WG modes.

[2] More than one 1D grating can be integrated to the structure, in order to diffract differently the various light emission components. Another grating can be processed on the top surface of the phosphor, as shown in FIG. 9, which illustrates a device 900 that includes a substrate 902, a buffer layer 904 with first and second gratings 906, 908, the latter also acting as a confining layer, a PES layer 910, and a phosphor layer 912, separated from the substrate 902 and buffer layer 904 by an air gap or a low index dielectric 914. The phosphor layer 912 may include a surface grating or photonic crystal 916. Moreover, in this figure, 918 comprises the WG modes from the PES layer 910, 920 comprises the light extracted from the PES layer 920, 922 comprises the WG modes from the phosphor layer 912 (the SES) and 924 comprises the light diffracted from the SES.

Alternatively, a 1D grating can be made with a periodicity such that the PES WG modes will be diffracted at angles nearly parallel to the layers. The diffracted light would then propagate nearly in-plane in the phosphor layer. This would be of interest since a larger absorption occurs when light can propagate over longer distances in an absorbing material. In planar devices, longer distances are available in-plane: a higher absorption of the PES light by the SES would then be achieved and only thin coatings of phosphors should be needed.

[3] Several 1D gratings can be integrated at different positions with different orientations for each of them to obtain diffraction in more than one direction.

[4] 2D photonic crystals acting as 2D diffraction gratings can be integrated instead of several 1D gratings, improving the extraction in all directions, while reducing processing complexity. In turn, more than one 2D photonic crystal can be used to affect the various light emission components differently. Other alternatives are available, but the scheme presented above would still be of practical interest in those new approaches, involving processes such as Lateral Epitaxy Overgrowth (LEO). (See U.S. Utility application Ser. No. 11/067,910, filed on Feb. 28, 2005, by Claude C. A. Weisbuch, Aurelien J. F. David, James S. Speck, and Steven P. DenBaars, entitled "SINGLE OR MULTI-COLOR HIGH EFFICIENCY LIGHT EMITTING DIODE (LED) BY GROWTH OVER A PATTERNED SUBSTRATE," no U.S. Pat. No. 7,291,864, issued Nov. 6, 2007, which application is incorporated by reference herein.) The right periodicity can be chosen as described above to allow both extractions.

[5] Confining layers can be introduced or substrate removal techniques applied to effectively thin down the main WG layer, in order to increase the outside WG mode leak or overlap with the photonic crystals and/or to possibly take advantage of microcavity effects. (See U.S. Utility application Ser. No. 11/067,956, filed on Feb. 28, 2005, by Claude C. A. Weisbuch, Aurelien J. F. David, and Steven P. DenBaars, entitled "HIGH EFFICIENCY LIGHT EMITTING DIODE (LED) WITH OPTIMIZED PHOTONIC CRYSTAL EXTRACTOR," now U.S. Pat. No. 7,582,910, issued Sep. 1, 2209, which application is incorporated by reference herein). The LEO technique could also be applied here in combination to a surface grating or photonic crystal 914 for the phosphor layer 910, similar to what is illustrated in FIG. 9.

[6] More than one emitting species can be included, both as PES or SES. The method can be applied to the UV or blue PES.

[7] Different SES can be positioned on different regions of a device to form multi-color pixels. In turn, for each type of pixel, a different photonic crystal can be processed to obtain homogeneous efficiency and directionality for all colors.

Figure 10A:
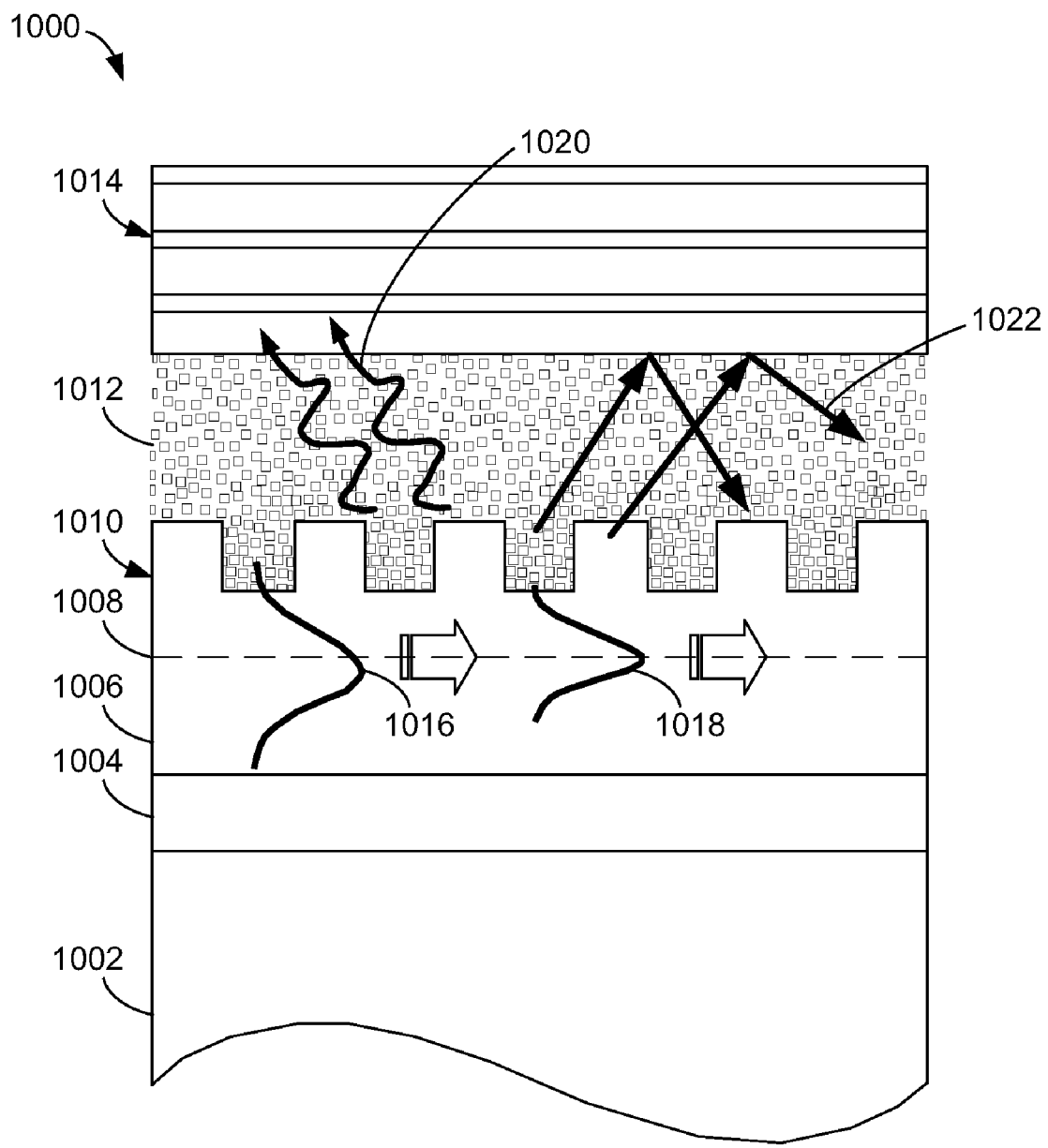
FIGS. 10A and 10B are device structures that illustrate photon recycling combined with the simultaneous extraction of both excitation (violet) and phosphors PL (green) WG modes for high light conversion efficiency.
Figure 10B:
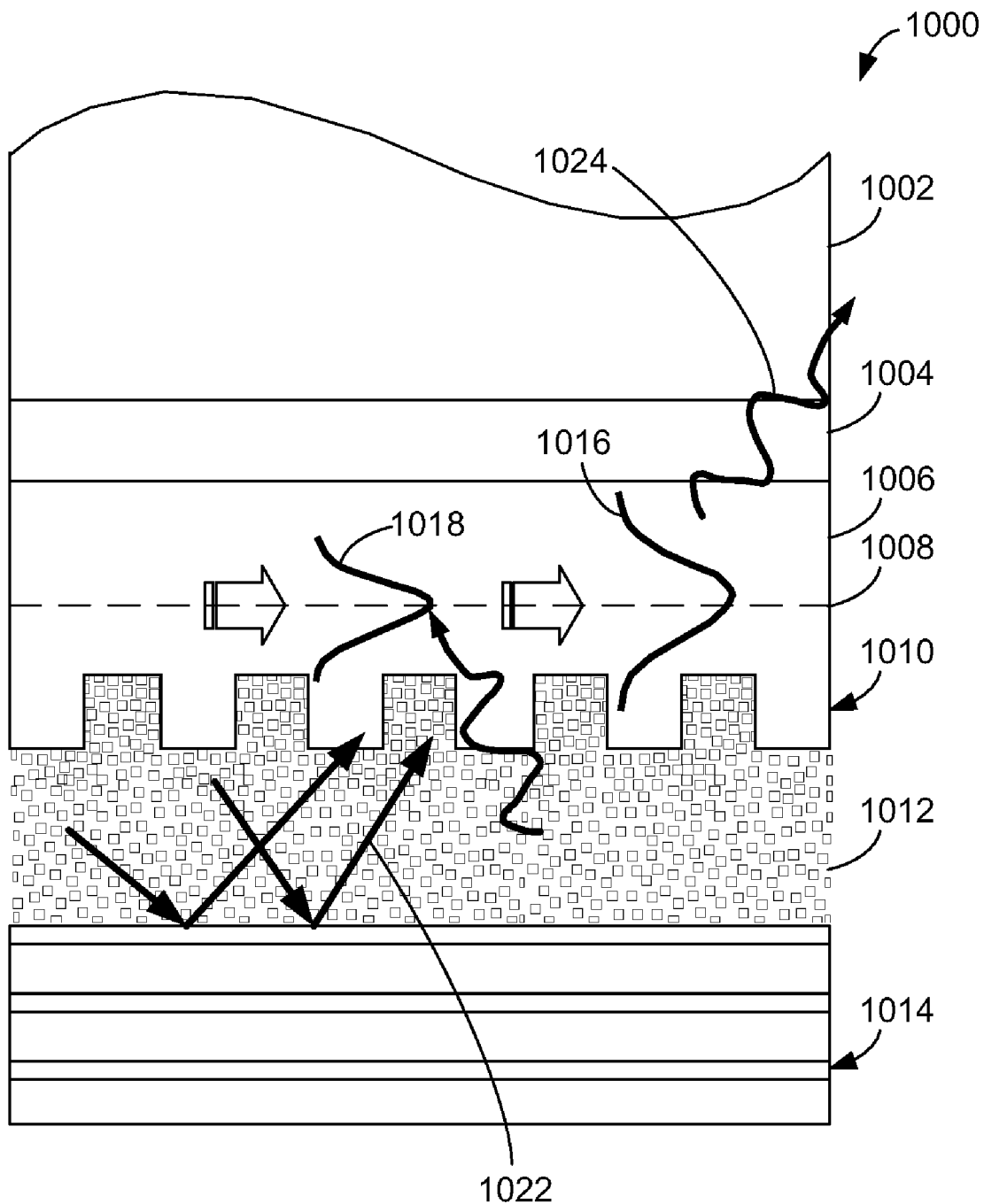

[8] The integration of metallic or dielectric mirrors (such as distributed Bragg reflectors or DBRs) positioned below or above the active layers can improve extraction efficiency, as shown in FIGS. 10A and 10B, which illustrate the use of photon "recycling" combined with the simultaneous extraction of both PES and SES WG modes for high light conversion efficiency. The directly extracted PES light can be redirected to have it perform more than one pass through the SES layer. This is done by introducing a metallic or dielectric mirror above the SES layer. Specifically, FIGS. 10A and 10B illustrate devices 1000 that each includes a substrate/buffer layer 1002, a confining layer 1004, an active layer 1006 including PES 1008, a grating 1010, phosphor layer 1012 and DBR 1014 for excitation transparent for the PL of the phosphor layer 1012. In FIG. 10A, the WG modes 1016, 1018 leak into the phosphor layer 1010, resulting in radiation modes 1020 and modes 1022 reflected by the mirror 1014. In FIG. 10B, the WG modes 1016, 1018 leak into the phosphor layer 1010, resulting in lost emission 1024 and modes 1022 reflected by the mirror 1014. The mirrors reflect both the directly extracted excitation and the radiation induced by the grating or photonic crystal lights.

Figure 11:
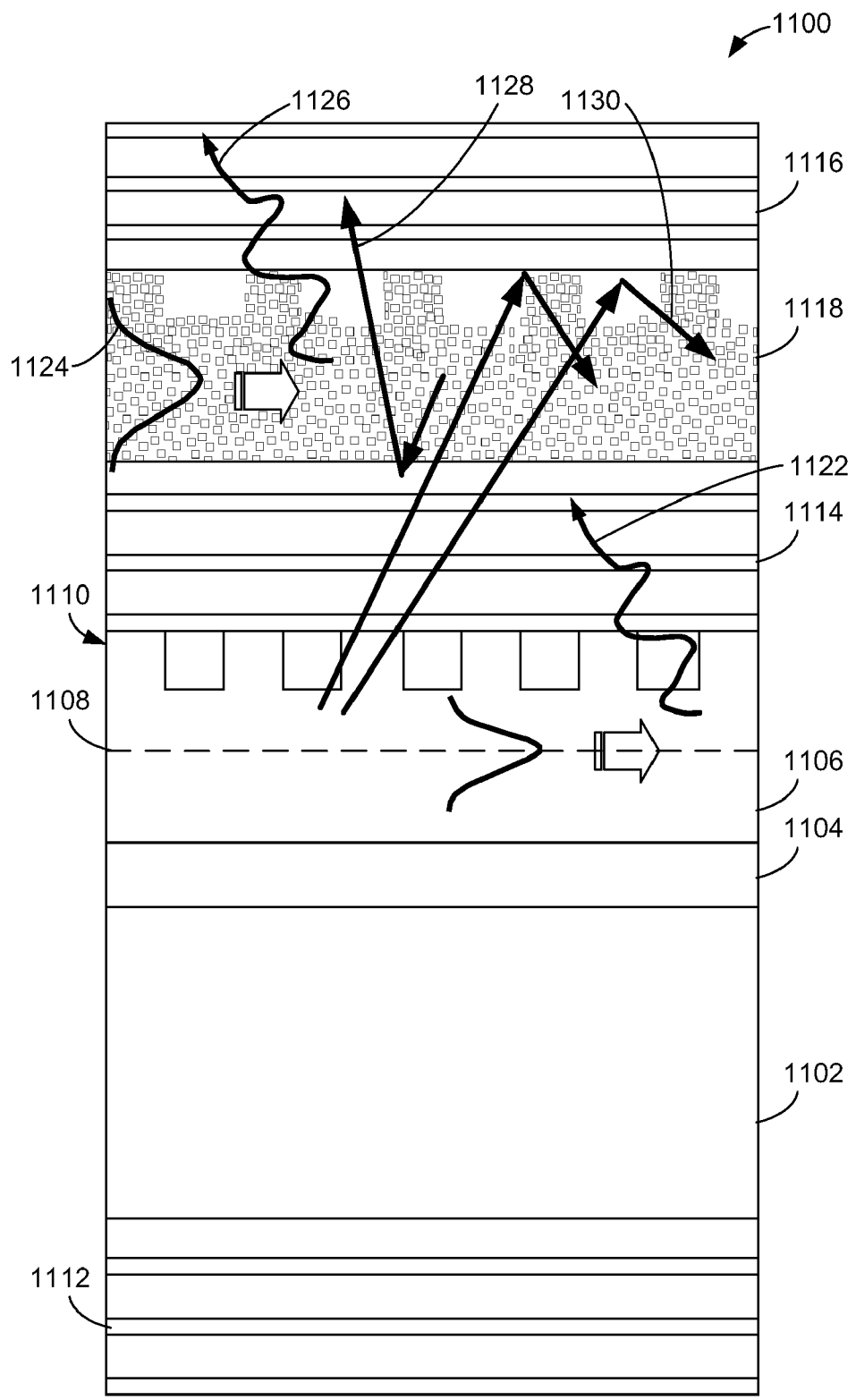
FIG. 11 is a device structure that illustrates photon recycling combined with the simultaneous extraction of both PES and SES WG modes for high light conversion efficiency, with intermediate layers for the improved coupling of the TIR or WG modes to the photonic crystals.

FIG. 11 illustrates how intermediate layers can be included between the phosphor and the high index layers also in combination with metallic or dielectric mirrors. Specifically, FIG. 11 illustrates a device 1100 that includes a substrate/buffer layer 1102, a patterned confining layer or DBR 1104, an active layer 1106 including PES 1108 and an air gap or a low index dielectric 1110. DBRs 1112, 1114, 1116 provide for excitation transparent for the PL of a phosphor layer 1118. The WG modes 1120 of the PES 1108 leak 1122 into the phosphor layer 1118, resulting in WG modes 1124 for the phosphor layer 1118 (SES), diffracted SES emissions 1126, and reflected modes 1128 and modes 1130.

The integration of metallic or dielectric mirrors also allows the device to redirect the portions of emitted light which escape in unwanted directions. This is accomplished by DBRs 1112, 1114, 1116. For example, DBR 1112 is placed below the substrate 1102 to reflect downwards propagating emissions upwards.

Other mirrors or DBRs can be positioned above and below the different emitting species in order to form microcavities (i.e., planar cavities with thicknesses on the order of one wavelength). This allows, for instance, the invention to improve the extraction efficiency and/or modify the directionality of the far-field emission pattern.

Direct processing over an active layer can induce defects and a loss of internal efficiency (for example, InGaN QWs can be damaged by dry etching). Alternative approaches to avoid the grating fabrication on the LED surface include:

[9] Fabrication of some of the photonic crystals on separate membranes with high index of refraction (for example, on $Si_3N_4$ membranes), which would then be positioned on the LEDs.

[10] Deposition of a sol-gel film with a high refractive index (e.g., $TiO_2$) on the LED surface to fabricate the photonic crystal and deposit the phosphor film subsequently.

Process Steps

Figure 12:
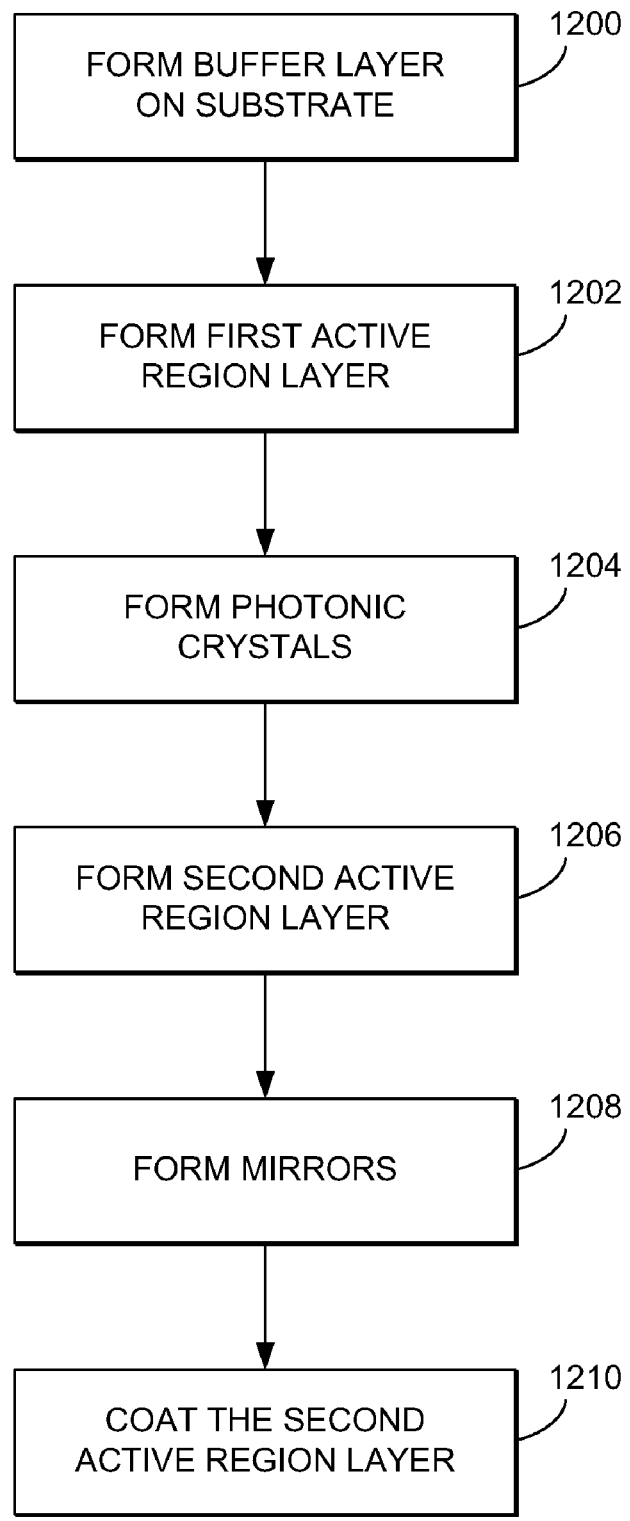
FIG. 12 is a flowchart illustrating the steps performed in the fabrication of a device according to a preferred embodiment of the present invention.

Finally, FIG. 12 is a flowchart illustrating the steps performed in the fabrication of a device according to an embodiment of the present invention.

Block 1200 represents the step of (optionally) forming a buffer layer on a substrate.

Block 1202 represents the step of forming a first active region layer on the buffer layer (or directly on the substrate, if the buffer layer is not used), wherein the first active region layer includes of one or more primary emitting species (PES) in a PES layer that are electrically-injected.

Block 1204 represents the step of forming one or more photonic crystals on the first active region layer. Preferably, the photonic crystals may comprise one or more intermediate layers integrated at different positions with different orientations to obtain diffraction in more than one direction, e.g., above or below the PES layer or the SES layer. In addition, one or more of the intermediate layers may be textured.

In the resulting structure, the photonic crystals, acting as scattering centers or diffraction gratings, extract evanescent WG modes emitted by the PES to optically pump the SES, extract the WG modes emitted by the SES, and control directionality or isotropy of far-field emission patterns.

In one embodiment, the photonic crystals are one-dimensional (1D) diffraction gratings that provide light extraction in all directions close to a direction perpendicular to the gratings. In another embodiment, the photonic crystals are periodic, quasi-periodic, or short-range ordered two-dimensional (2D) scattering centers or diffraction gratings that provide omni-directional light extraction or directional far-field emission patterns. In yet another embodiment, the photonic crystals are randomly textured two-dimensional (2D) scattering regions that provide omni-directional light extraction and isotropic emission far-field patterns.

Parameters of the photonic crystals may be chosen such that light extraction is optimized upwards or downwards. Moreover, the parameters of the photonic crystals may vary across the LED.

Block 1206 represents the step of forming a second active region layer on the photonic crystals, wherein the second active region layer includes of one or more secondary emitting species (SES) in an SES layer that are optically-pumped.

Block 1208 represents the step of (optionally) forming metallic or dielectric mirrors on the device. The mirrors may be used for redirecting portions of emitted light that escape in unwanted directions, or the mirrors may be used to recycle light emitted from the PES or SES. Further, the mirrors may be positioned above or below the PES layer or the SES layer to form microcavities.

Block 1210 represents the step of (optionally) coating the SES layer with another layer providing air insulation or improved light extraction efficiency.

Note that other embodiments may alter the order of steps or repeat various steps, in order to form the photonic crystals proximate to the first and second active regions, although not necessarily between the first and second active regions.

In addition, although in one embodiment, the first active region, second active region and photonic crystals are supported by a substrate, other embodiments may add the step of removing the first active region, second active region and photonic crystals from the substrate, and then supporting the first active region, second active region and photonic crystals on some other structure.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A high efficiency light emitting diode (LED) comprising:
    (a) a first region for emitting light at a first wavelength when electrically-injected;
    (b) one or more second regions for emitting light at a second wavelength when optically-pumped by the light emitted by the first region at the first wavelength; and
    (c) one or more photonic crystals for extracting total internal reflection (TIR) or waveguided (WG) modes of the light emitted by both the first and second regions.

2. The LED of claim 1, wherein different ones of the second regions are positioned on different regions of the LED to form multi-color pixels.

3. The LED of claim 2, wherein each type of pixel in the multi-color pixels has a different photonic crystal to obtain homogeneous efficiency and directionality for all colors.

4. The LED of claim 1, wherein the second regions are positioned relative to a low refraction index layer, to prevent coupling of the second regions's evanescent waves to the TIR or WG modes of the light emitted by the first region or the second regions.

5. The LED of claim 1, wherein the photonic crystals increase excitation of the second regions by the light emitted by the first region at the first wavelength.

6. The LED of claim 1, wherein the photonic crystals are one-dimensional (1D) gratings that diffract different components of the light differently, and the light is emitted by the first region or the second regions.

7. The LED of claim 1, wherein the photonic crystals are one-dimensional (1D) gratings having a periodicity, such that the TIR or WG modes of the light emitted by the first region or the second regions are diffracted at angles nearly parallel to the LED's layers, so that the diffracted light propagates nearly in-plane in second regions' layer.

8. The LED of claim 1, wherein the photonic crystals are one-dimensional (1D) gratings integrated at different positions on the LED with different orientations to diffract the light emitted by the first region or the second regions in more than one direction.

9. The LED of claim 1, wherein the photonic crystals are two-dimensional (2D) gratings that improve extraction of the light emitted by the first region or the second regions in more than one direction.

10. The LED of claim 1, wherein the photonic crystals are fabricated on separate membranes and then are positioned on the LED.

11. The LED of claim 1, further comprising means for confining or thinning one or more layers containing the TIR or WG modes, in order to increase the TIR or WG modes' overlap with the photonic crystals.

12. A method of fabricating a high efficiency light emitting diode (LED), comprising:
    (a) forming a first region for emitting light at a first wavelength when electrically-injected;
    (b) forming one or more second regions for emitting light at a second wavelength when optically-pumped by the light emitted by the first region at the first wavelength; and
    (c) forming one or more photonic crystals, to extract total internal reflection (TIR) or waveguided (WG) modes of the light emitted by both the first region or the second regions.

13. The method of claim 12, wherein different ones of the second regions are positioned on different regions of the LED to form multi-color pixels.

14. The method of claim 13, wherein each type of pixel in the multi-color pixels has a different photonic crystal to obtain homogeneous efficiency and directionality for all colors.

15. The method of claim 12, wherein the second regions are positioned relative to a low refraction index layer, to prevent coupling of the second regions's evanescent waves to the TIR or WG modes of the light emitted by the first region or the second regions.

16. The method of claim 12, wherein the photonic crystals increase excitation of the second regions by the light emitted by the first region at the first wavelength.

17. The method of claim 12, wherein the photonic crystals are one-dimensional (1D) gratings that diffract different components of the light differently, and the light is emitted by the first region or the second regions.

18. The method of claim 12, wherein the photonic crystals are one-dimensional (1D) gratings having a periodicity, such that the TIR or WG modes of the light emitted by the first region or the second regions are diffracted at angles nearly parallel to the LED's layers, so that the diffracted light propagates nearly in-plane in the second regions' layer.

19. The method of claim 12, wherein the photonic crystals are one-dimensional (1D) gratings integrated at different positions on the LED with different orientations, to diffract the light emitted by the first region or the second regions in more than one direction.

20. The method of claim 12, wherein the photonic crystals are two-dimensional (2D) gratings that improve extraction of the light emitted by the first region or the second regions in more than one direction.

21. The method of claim 12, wherein the photonic crystals are fabricated on separate membranes and then are positioned on the LED.

22. The method of claim 12, further comprising confining or thinning one or more layers containing the TIR or WG modes, in order to increase the TIR or WG modes' overlap with the photonic crystals.

23. A device fabricated according to the method of claim 12.

* * * * *